United States Patent
Akiba et al.

(10) Patent No.: US 7,135,669 B2
(45) Date of Patent: Nov. 14, 2006

(54) LOW-LEVEL LIGHT DETECTOR AND LOW-LEVEL LIGHT IMAGING APPARATUS

(75) Inventors: Makoto Akiba, Koganei (JP); Mikio Fujiwara, Koganei (JP)

(73) Assignee: National Institute of Information and Communications Technology Incorporated Administrative Agency, Tokyo (JP)

( * ) Notice: Subject to any disclaimer, the term of this patent is extended or adjusted under 35 U.S.C. 154(b) by 0 days.

(21) Appl. No.: 11/090,162

(22) Filed: Mar. 28, 2005

(65) Prior Publication Data

US 2006/0163454 A1 Jul. 27, 2006

(30) Foreign Application Priority Data

Jan. 21, 2005 (JP) ............................. 2005-014139

(51) Int. Cl.
*H03F 3/08* (2006.01)
*H03K 3/42* (2006.01)

(52) U.S. Cl. .................................. 250/214 R; 327/514

(58) Field of Classification Search ............ 250/214 R, 250/214 VT, 214.1, 214 A, 551; 327/514
See application file for complete search history.

(56) References Cited

U.S. PATENT DOCUMENTS

2002/0043614 A1 * 4/2002 Miyamoto et al. ...... 250/214 A

* cited by examiner

*Primary Examiner*—Stephone B. Allen
*Assistant Examiner*—Suezu Ellis
(74) *Attorney, Agent, or Firm*—Oblon, Spivak, McClelland, Maier & Neustadt, P.C.

(57) ABSTRACT

A low-level light detector includes an avalanche photodiode (APD) to which is applied a bias voltage adjusted to produce a multiplication factor of not more than 30, and a capacitor for accumulating carriers produced by light in the APD and multiplied using the APD characteristics, the capacitor being connected to the avalanche photodiode. The detector detects the intensity of light impinging on the avalanche photodiode by periodically reading the capacitor voltage and obtaining time-based differences in the voltage, or by resetting the capacitor voltage to a predetermined voltage each time the capacitor voltage is read.

2 Claims, 7 Drawing Sheets

F I G. 3
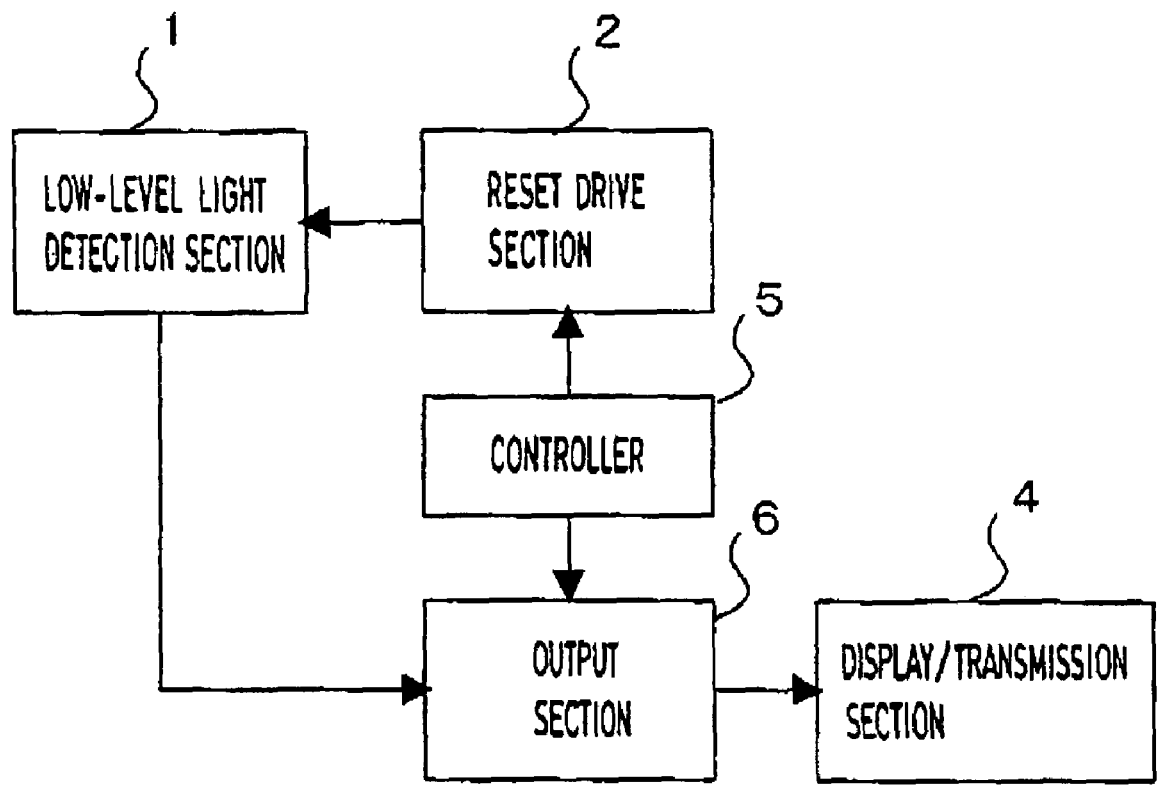

Famp: Noise factor of next-stage amplifier
Rin: Input resistance of next-stage amplifier
k: Boltzmann constant
T: Absolute temperature

LOW-LEVEL LIGHT DETECTOR AND LOW-LEVEL LIGHT IMAGING APPARATUS

BACKGROUND OF THE INVENTION

1. Field of the Invention

This invention relates to a low-level light detector and low-level light imaging apparatus using an avalanche photodiode, having a linear sensitivity to the intensity of the low-level light.

2. Description of the Prior Art

Light detectors used to detect low-level light include avalanche photodiodes (APDs), photomultiplier tubes (PMT) and CCD cameras. However, in fields such as nanotechnology and other leading-edge areas of biology and chemistry that involve the handling of DNA and environmental endocrine disruptors and the like, it is necessary to detect light that is of a weakness that is difficult to measure using the above light detectors. Moreover, there are a number of problems that limit the methods of using the above detectors. The low multiplication noise light detector developed has excellent characteristics that enable higher-sensitivity in light detection than the above light detectors and also enable the problems of the above light detectors to be solved.

An APD or PMT multiplies a photoelectric current comprised of electrons produced from light, and can even enable detection of single photons if the current can be multiplied to a high enough level compared with the noise of the amplification stage. A detector that detects photons one by one is called a photon counter, and represents the most sensitive light detection method known. However, photon counters using APDs and PMTs have a number of problems that make this a less-than-perfect detection method. For example, these photon counters cannot measure low-level light in which only one photon per second hits the detector. The reason for this is as follows.

Dark current exists in APDs and PMTs, which is a current that flows when no light falls incident on the photodetector. Dark current is not constant, but is always varying. If the dark current reaches a high level that is higher than the current produced by incident light, it can result in an output that seems to be produced by the impinging of light. When an APD or PMT is used to constitute a photon counter, the dark current can therefore give rise to a photon count even when there is no incident light. This is known as the dark count. In the case of a PMT, the dark count is a relatively low few counts per second, but in the case of an APD the dark count is 100 or more per second. Quantum efficiency is another factor that hinders detection of low-level light. In the case of a photon counter, the quantum efficiency shows the proportion of incident light in terms of the photon count. If all of incident light is counted, the quantum efficiency is 100%. Thus, the lower the quantum efficiency is, the higher the possibility becomes that a single incident photon will not be counted, lowering the sensitivity. A PMT has a low dark current but also a low quantum efficiency of around 20% at most. In the case of longer wavelengths over 600 nm, the efficiency decreases sharply to 1% or less. PMTs are being developed having a relatively high quantum-efficiency in the near-infrared region, but due to the increase in the dark current, there is no outstanding improvement in the detection sensitivity. Generally, compared with PMTs, APDs have a higher quantum efficiency that can reach 90%. The quantum efficiency is especially high in the wavelength range of 600 nm to 1 µm, which can make it possible to achieve a higher sensitivity with an APD, even after taking the higher dark current into account.

A problem common to both APDs and PMTs is multiplication noise. Neither an APD nor a PMT can multiply the photoelectric current at a fixed rate; the multiplication factor always has a certain distribution. This fluctuation in the multiplication is termed the multiplication noise. A high multiplication noise makes it difficult to distinguish between events when the number of photons incident on the APD is one or two or more. That is, existing APD-based photon counters cannot distinguish the number of simultaneously incident photons. There are reports of PMTs having a lower multiplication noise than an APD that can distinguish between several levels of incident photon numbers, but only after extensive statistical calculations; on a real time basis, distinguishing between the numbers of incident photons is difficult.

Generally lowering the multiplication factor reduces the multiplication noise. So, a desirable method of using an APD or PMT as a photon counter is to reduce the multiplication factor and to decrease the multiplication noise until the output current is proportional to the number of incident photons. This method is done using what is called the linear mode or the gain mode. However, it becomes impossible to detect single photons due to the low multiplication factor, resulting in reduced sensitivity.

It therefore follows that these photon counters cannot be used for a short-pulse light source to measure how much light is produced per pulse. This shows that it is very difficult to measure high-speed phenomena requiring the use of short pulses, or optical non-linear phenomena using an APD or PMT. For this purpose, a camera, such as a CCD camera as described below, is used.

Recently available on the market are CCD cameras that are capable of measuring single photons. With their very highly linear output with respect to the number of incident photons, these cameras are being extensively used as light detectors that complement APDs and PMTs. Because of their linearity with respect to the number of incident photons, CCD cameras can also be used for pulsed-source measurement, which is difficult using an APD- or PMT-based photon counter. However, the small area of each CCD pixel (10 to 20 square µm) makes a CCD camera unsuited in cases where there is a relatively large-area light source when it is not necessary to capture an image, or where as much as possible of the light radiating in various directions is to be collected. Because it is so difficult to cram into a small area light from a large area light source or light radiating at a large angle, such light unavoidably becomes dispersed over a number of CCD pixels. When this happens, in order to measure the overall intensity of the incident light it is necessary to add together the outputs from the pixels on which the light fell, which also results in an increase in the noise. This is because the noise from the individual pixels is also added together. If the outputs from the pixels on which the light did not fall are also added, the intensity of the incident light will stay the same but the noise will increase. Thus, it is necessary to choose the pixels that are added together in line with the spatial spread of the incident light. This being the case, with respect to a large-area light source, the sensitivity of a CCD camera is not necessarily good.

The characteristics of an APD can be readily understood from the multiplication factor or by using the distribution of the pulse height in the APD output when photons fall incident thereon. To compare the pulse height with the noise level, pulse-height distribution will now be used to explain amplifier noise and APD sensitivity. FIG. 6 shows the probability distribution with respect to the height of a current pulse produced when a single photon falls incident on the APD. The horizontal axis is pulse height and the vertical axis is the probability of a pulse of that height being produced. Looking at FIG. 6, it can be seen that the probability grows as the pulse height decreases, with the probability reaching a maximum when the pulse height is at its smallest, meaning it has not been amplified at all. In principle, photon detection is determined by the presence or absence of a photoelectric current. In this case, the pulse height is not used in the determination, so the distribution thereof is unrelated to the sensitivity. However, since, as described above, photon detection is determined by the presence or absence of a photoelectric current, as in the case of an ordinary photodiode, the quantum efficiency that is the probability of the incident light generating one photoelectron can be applied with no modification to the APD.

The present invention uses an APD in which the avalanche effect is used to amplify the number of electrons. It is characterized by using a concatenated generation of electrons to multiply the number of carrier electrons. The higher the energy of each electron means the higher the overall number of electrons that are produced. So, in order to increase the multiplication factor, it is necessary to apply a high field.

However, there is a drawback by increasing the speed of the electrons. Excessively speeding up electrons decreases the excitation scattering cross-section (the probability of carrier electrons being produced). Therefore, in the case of an APD which uses the avalanche effect, the highest probability is that the first photoelectron produced by incident light will be output without any amplification. That is the reason for the high probability at minimum pulse height shown in FIG. 6.

In conventional APDs, the photoelectric current is multiplied to surpass the subsequent amplifier noise. When multiplication factor and pulse height are low, a pulse output by the APD in response to a single photon will be buried in the amplifier noise. Therefore, inputting APD output pulses to the counter as they are, after they have been input to the amplifier, will generate a lot of erroneous counts, due to the amplifier noise. Generally, in order to prevent this happening, a threshold value that is higher than the amplifier noise is used, so that only output pulses that exceed the threshold value are counted. As shown in FIG. 9, which shows output relative to multiplication factor, amplifier output includes thermal noise and shot noise. The point at which the detected signal exceeds this noise at which the signal-to-noise ratio is at a maximum is selected as the operating point.

Also, a photon falling incident on the APD when the multiplication factor happens to be low is discarded. It is usual for this non-counting of photons that are thus discarded to be thought of as included in the quantum efficiency. That means that the quantum efficiency of a conventional APD is that much worse than a conventional photodiode.

As described above, in an APD or PMT, the multiplication noise decreases with the decrease in the multiplication factor, so that if the amplifier noise can be reduced, it will also be possible to reduce the multiplication factor, thereby reducing the multiplication noise. However, as shown in FIG. 6, reducing the multiplication factor does not have much of an effect on the shape of the multiplication factor distribution: the probability of occurrence is still higher when the multiplication factor is low. Therefore, as can be understood from FIG. 6, even if the multiplication factor is reduced (decreasing output pulse height), along with the threshold value, no major improvement in quantum efficiency can be expected. In fact, from the standpoint of improving the quantum efficiency, it would be better to decrease the threshold value and not change the multiplication factor. That is to say, as long as a conventional APD is to be used without modification, virtually the only way the sensitivity can be improved is to reduce the amplifier noise. And, since reducing just the amplifier noise will leave the multiplication noise unchanged, the linearity of the output current relative to the number of incident photons cannot be improved.

Due to such problems, the present invention employs an APD multiplier that utilizes slow electrons. That is, in contrast to the prior art in which electrons accelerated to a high speed are used to produce a strong avalanche effect, slow electrons are prepared in the acceleration voltage region where there is a high excitation cross-section. Normally, the slower the electrons, the larger the excitation scattering cross-section, but below a fixed excitation energy above that required to produce new carrier electrons, a sharp decrease takes place. Therefore, as a function relative to electron speed, the scattering cross-section peaks at around a speed at which the kinetic energy is around several times the excitation energy. If the electron speed is brought to within this vicinity, electrons excitation takes place with a high probability, ensuring the photoelectrons generate the next carrier electrons. Ensuring the electrons thus generated are all, also low-speed ensures the further generation of carrier electrons, reducing the fluctuations in the multiplication factor.

An object of this invention is to provide a low-level light detector and low-level light imaging apparatus that in low-level light regions maintain a linear relationship between light intensity and detection sensitivity, using an APD that can readily increase the light receiving area per element and in which the light receiving element itself has an amplifying action.

Another object is to provide a low-level light detector and low-level light imaging apparatus that can detect voltage that is proportional to the number of incident photons when irradiated by low-level light, and which also have a high quantum efficiency.

SUMMARY OF THE INVENTION

To attain the above object, the invention provides a low-level light detector comprising an avalanche photodiode with a bias voltage adjusted to produce a multiplication factor of up to 30, and a capacitor connected to the avalanche photodiode for accumulating carriers produced and multiplied in the avalanche photodiode, wherein the low-level light detector detects an intensity of light impinging on the avalanche photodiode by periodically reading capacitor voltages and obtaining differences between the voltages.

The object is also attained by a low-level light detector comprising an avalanche photodiode with a bias voltage adjusted to produce a multiplication factor of up to 30, and a capacitor connected to the avalanche photodiode for accumulating carriers produced and multiplied in the avalanche photodiode, wherein the low-level light detector detects an intensity of light impinging on the avalanche photodiode by periodically reading capacitor voltage and resetting the capacitor voltage to a predetermined voltage each time it carries out the reading.

The object is also attained by a low-level light imaging apparatus comprising avalanche photodiodes with a bias voltage adjusted to produce a multiplication factor of up to 30, the avalanche photodiodes being arranged in a one-dimensional array or a two-dimensional array, wherein the low-level light imaging apparatus detects an intensity of light impinging on an avalanche photodiode by reading amounts of carriers produced by light irradiated in each avalanche photodiode and multiplied by bias voltage applied.

The object is also attained by a low-level light imaging apparatus comprising avalanche photodiodes with a bias voltage adjusted to produce a multiplication factor of up to 30, the avalanche photodiodes being arranged in a one-dimensional array or a two-dimensional array, and a capacitor connected to each avalanche photodiode for accumulating carriers produced and multiplied in each avalanche photodiode, wherein the low-level light imaging apparatus detects an intensity of light impinging on an avalanche photodiode by reading capacitor voltage.

The object is also attained by a low-level light imaging apparatus comprising avalanche photodiodes with a bias voltage adjusted to produce a multiplication factor of up to 30, the avalanche photodiodes being arranged in a one-dimensional array or a two-dimensional array, and a capacitor connected to each avalanche photodiode for accumulating carriers produced and multiplied in each avalanche photodiode, wherein the low-level light imaging apparatus detects an intensity of light impinging on an avalanche photodiode by resetting capacitor voltage to a predetermined voltage each time it reads the capacitor voltage, and by reading the capacitor voltage.

The above and other features of the present invention will become apparent from the following description made with reference to the drawings.

BRIEF DESCRIPTION OF THE DRAWINGS

FIG. 3 is a block diagram of another example of a low-level light detector configured using the low-level light detection section of FIG. 1.

DESCRIPTION OF THE PREFERRED EMBODIMENT

Embodiments of the invention will now be described with reference to the accompanying drawings. In the following description, the same symbols are used for functions that are the same or similar, except when there is a particular reason not to do so. The description of the embodiments starts with FIG. 1.

EXAMPLE 1

Figure 7:
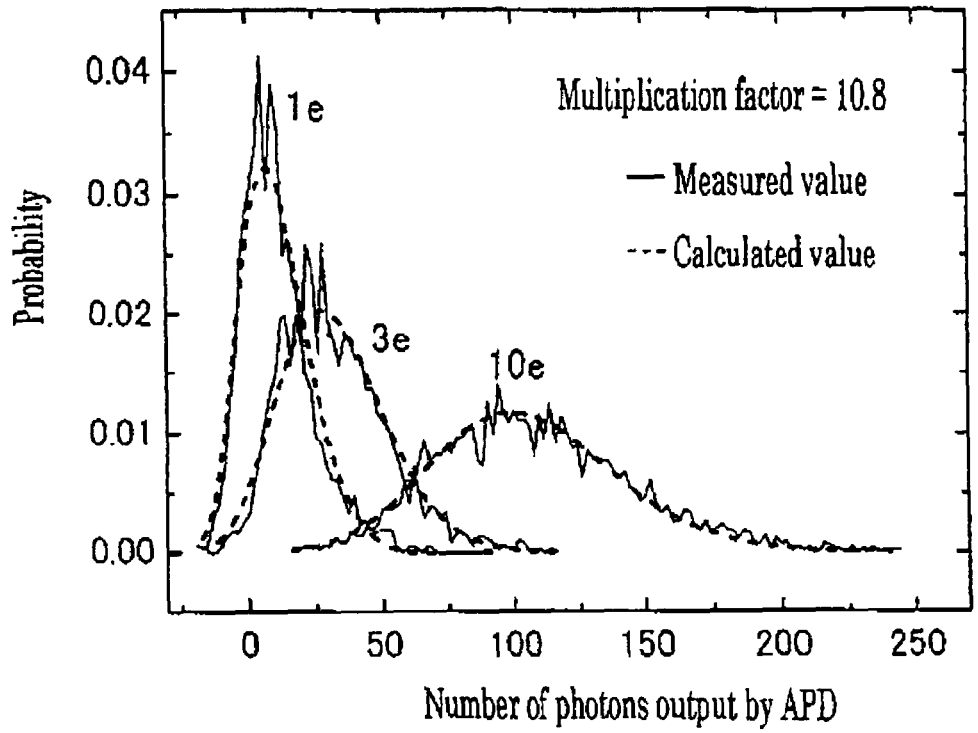
FIG. 7 is a graph showing the number of electrons output when the light source is adjusted to produce 1, 3 and 10 photoelectrons.

In order to confirm that using slow electrons reduces multiplication noise, the present inventors carried out the following experiment, using a conventional Si-APD. Using the circuit shown in FIG. 1, a bias voltage considerably smaller than the bias voltages used in the prior art was applied to the Si-APD and the multiplier noise measured. The results are shown in FIG. 7, which is a graph of the numbers of electrons output when the incident light intensity was adjusted to produce 1, 3 and 10 photoelectrons in the Si-APD. The broken lines indicate calculated values, using amplifier noise ($7e$), average multiplication factor (10.8 times) and the like measured beforehand, assuming fluctuation of light source photons caused by shot noise. These calculations do not include multiplication fluctuation. It can be seen that there is a good correspondence between measured and calculated values, which shows that the multiplier noise is adequately lower than the amplifier noise. It can also be seen that outputs were obtained that were substantially proportional to the numbers of photoelectrons. Multiplication noise calculated from the measured values was found to be in the order of 1.07, in terms of excess noise factor. With the assumption being that shot noise causes the number of photons to fluctuate, the excess noise factor is an indication of how much the shot noise is increased by the APD. An excess noise factor of 1 means there is no increase in shot noise, so the above value indicates there was almost no multiplication noise caused by the APD.

Figure 6:
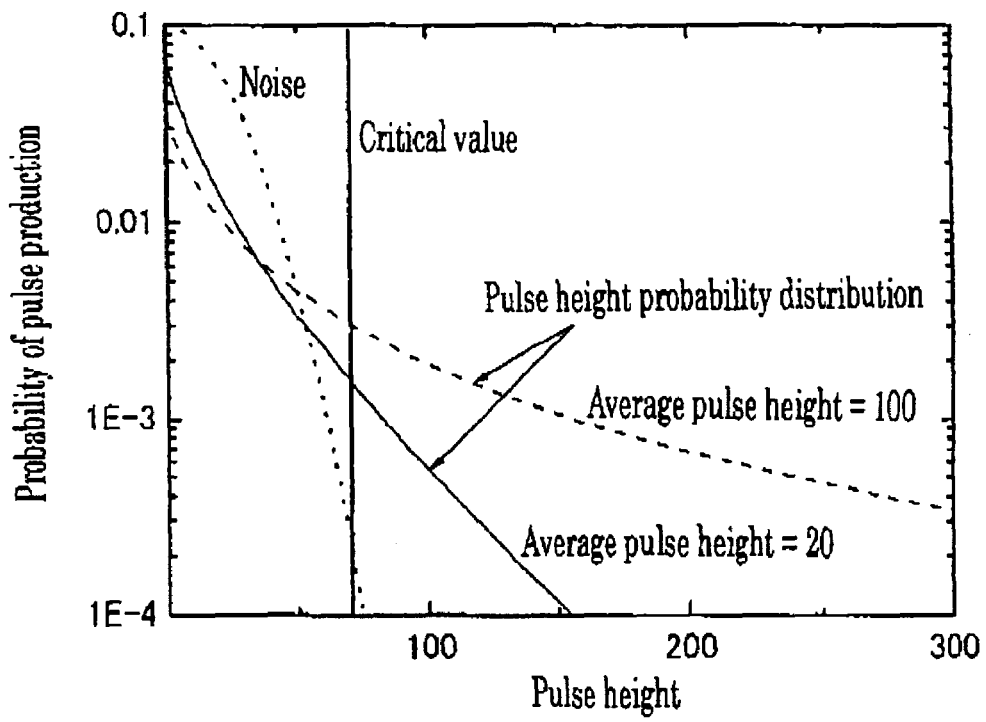
FIG. 6 shows the probability distribution with respect to the height of a current pulse produced when a single photon impinges on the APD.

The pulse height distribution of FIG. 6 is well explained by APD multiplication noise theory widely accepted so far, according to which in the case of a multiplication factor of 10, the excess noise factor is around 2, but it cannot explain the measured results of FIG. 7. There is a recent theory in which the excess noise factor is slightly lower, but even that decrease is not as much as 10%, from which it is clear that the multiplication under the above experimental conditions is a substantially different multiplication from the conventional thinking. In measurements of multiplication noise made up until now, none have been made using the above-described low multiplication factor setting. That is due to the fact that, before now, the high level of amplifier noise made it impossible to measure an excess noise factor at the low multiplication factor of 10. However, measurements at such a low multiplication factor were made possible by the good noise characteristics of the amplifier shown in FIG. 1, which is an ultra-low-noise amplifier.

Figure 8:
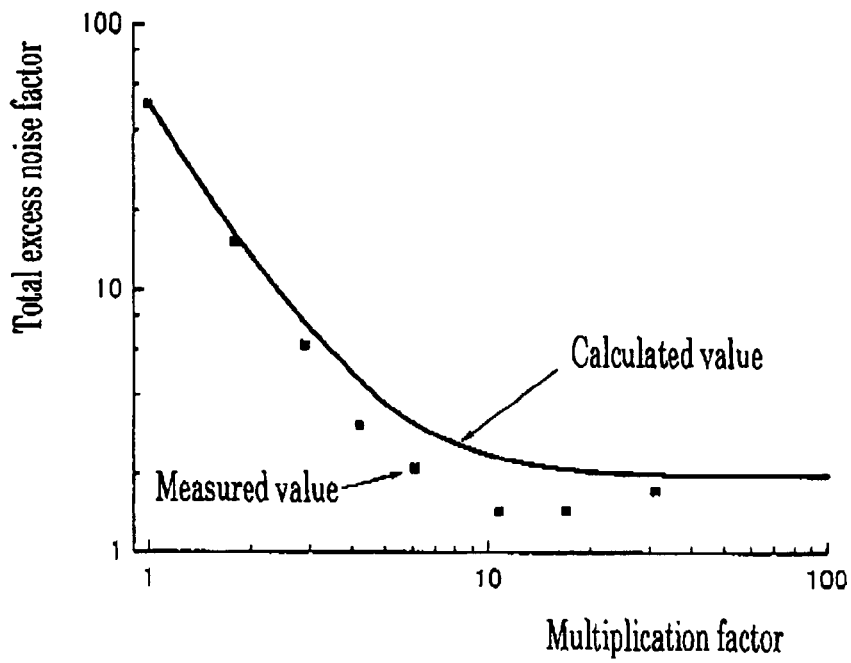
FIG. 8 is a graph showing the relationship between the measured total excess noise factor and multiplication factor.
Figure 9:
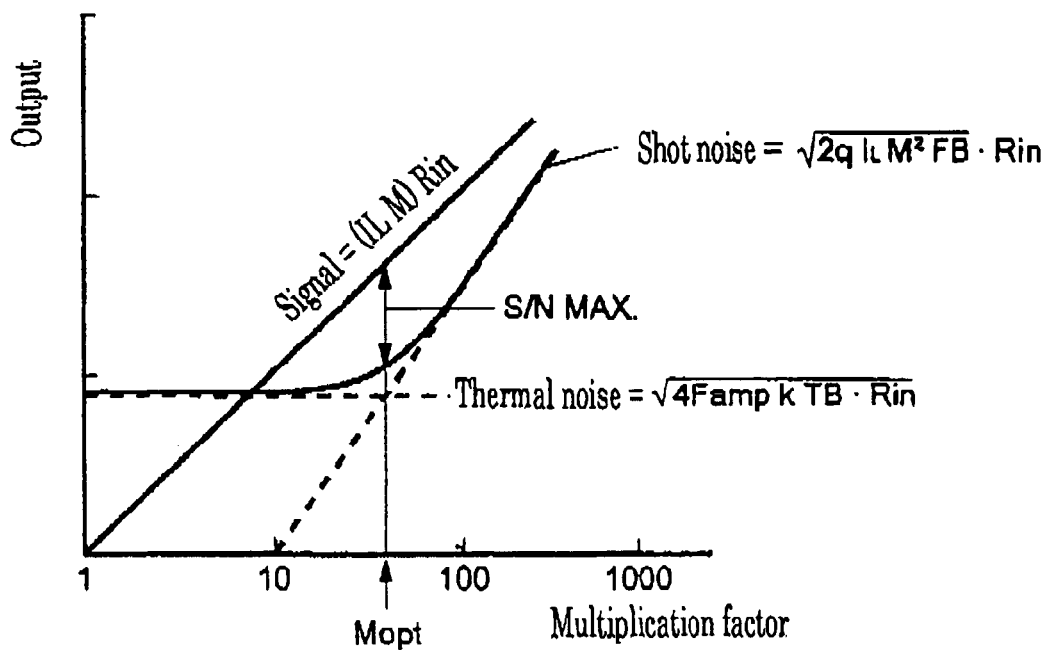
FIG. 9 shows the relationship between output and multiplication factor.

FIG. 8 is a graph showing the relationship between the total excess noise factor (similarly to the excess noise factor of the APD, a calculated value that includes amplifier noise as well as APD noise is used as the total excess noise factor) and multiplication factor, obtained by the above measurements. It can be seen that when the multiplication factor is not more than 30, the measured values are lower than the calculated values.

As described in the foregoing, the above-described characteristics are manifested by adjusting the bias voltage applied to the APD so that the multiplication factor is not more than 30. However, it is clear that this is not something that should be limited to the circuit of FIG. 1. The important point here is, first, as the APD operating point, the bias voltage should be low enough to bring the multiplication factor to not higher than 30.

EXAMPLE 2

Figure 1:
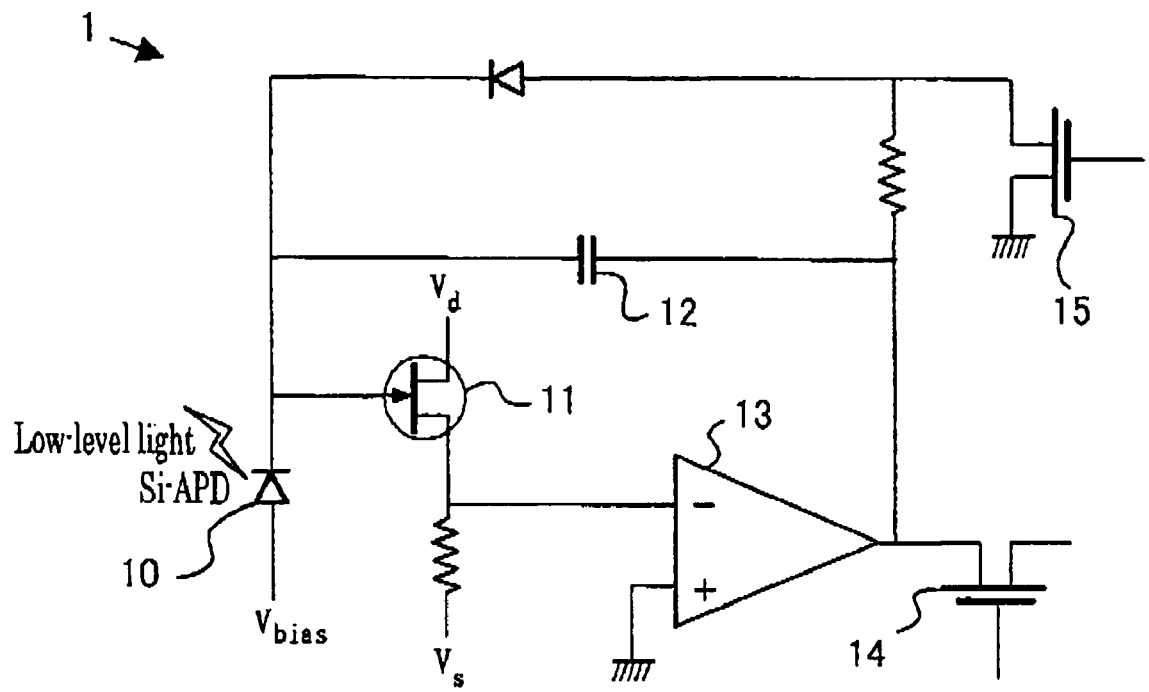
FIG. 1 is a circuit diagram of an embodiment of a low-level light detection section according to the present invention.

In the low-level light detection section 1 of FIG. 1, a signal from APD 10 is received by transistor 11, subjected to impedance conversion by a source follower circuit and input to amplifier 13. Feedback capacitor 12 and the amplification section constituted by transistor 11 and amplifier 13 constitute an integrator in which input charges are accumulated. The accumulation state is output to an external circuit, via output gate 14. Also, reset switch 15 is used to discharge accumulated charges before it becomes impossible for charges to accumulate in the feedback capacitor 12. This reset is controlled by the reset drive section 2 of FIG. 2. When the low-level light detection section 1 reads out the light intensity, the output voltage of the amplifier 13 is read, but obtaining the amount of irradiated light per unit time is done by using the difference output section 3 of FIG. 2 to obtain differences in the output voltage of the amplifier 13. Display/transmission section 4 is used to display the data thus obtained and transmit the data to other data processing means.

Figure 2:
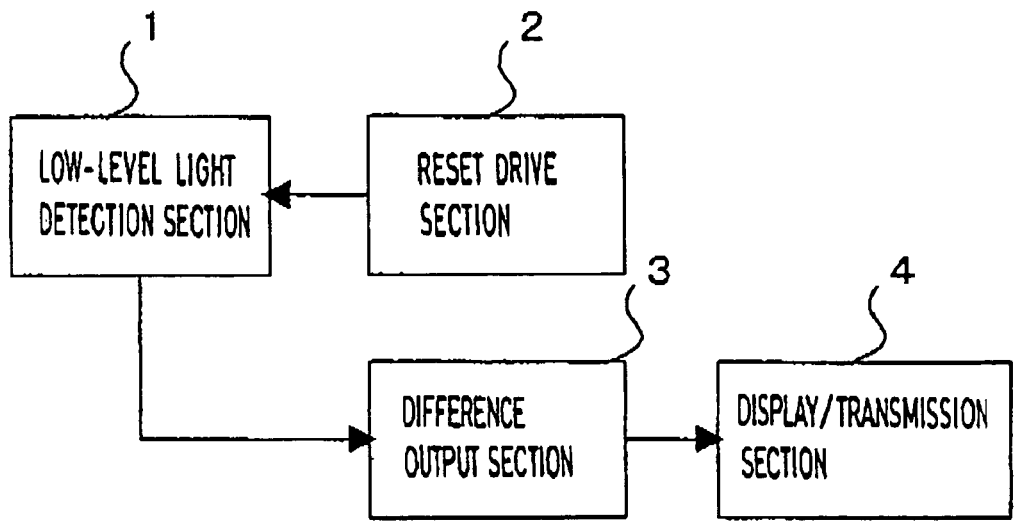
FIG. 2 is a block diagram of an example of a low-level light detector configured using the low-level light detection section of FIG. 1.

FIG. 2 is a block diagram of an example of a low-level light detector configured using the detection section of FIG. 1. The reset drive section 2 outputs a reset signal that resets the reset switch 15 of FIG. 1, and the difference output section 3 receives the output from the output gate 14 of FIG. 1 and outputs the time-based change amount to the display/transmission section 4, where it is displayed and transmitted to other processing means.

FIG. 3 is a block diagram of the low-level light detection section 1 configured so that the feedback capacitor 12 is reset each time it is read. In accordance with an instruction from a controller 5, output section 6 performs a readout, which is followed by a reset by the reset drive section 2. A merit of the configuration of FIG. 3 is that the size of the feedback capacitor 12 can be reduced, making it easier to increase the output voltage of the amplifier 13.

Figure 10:
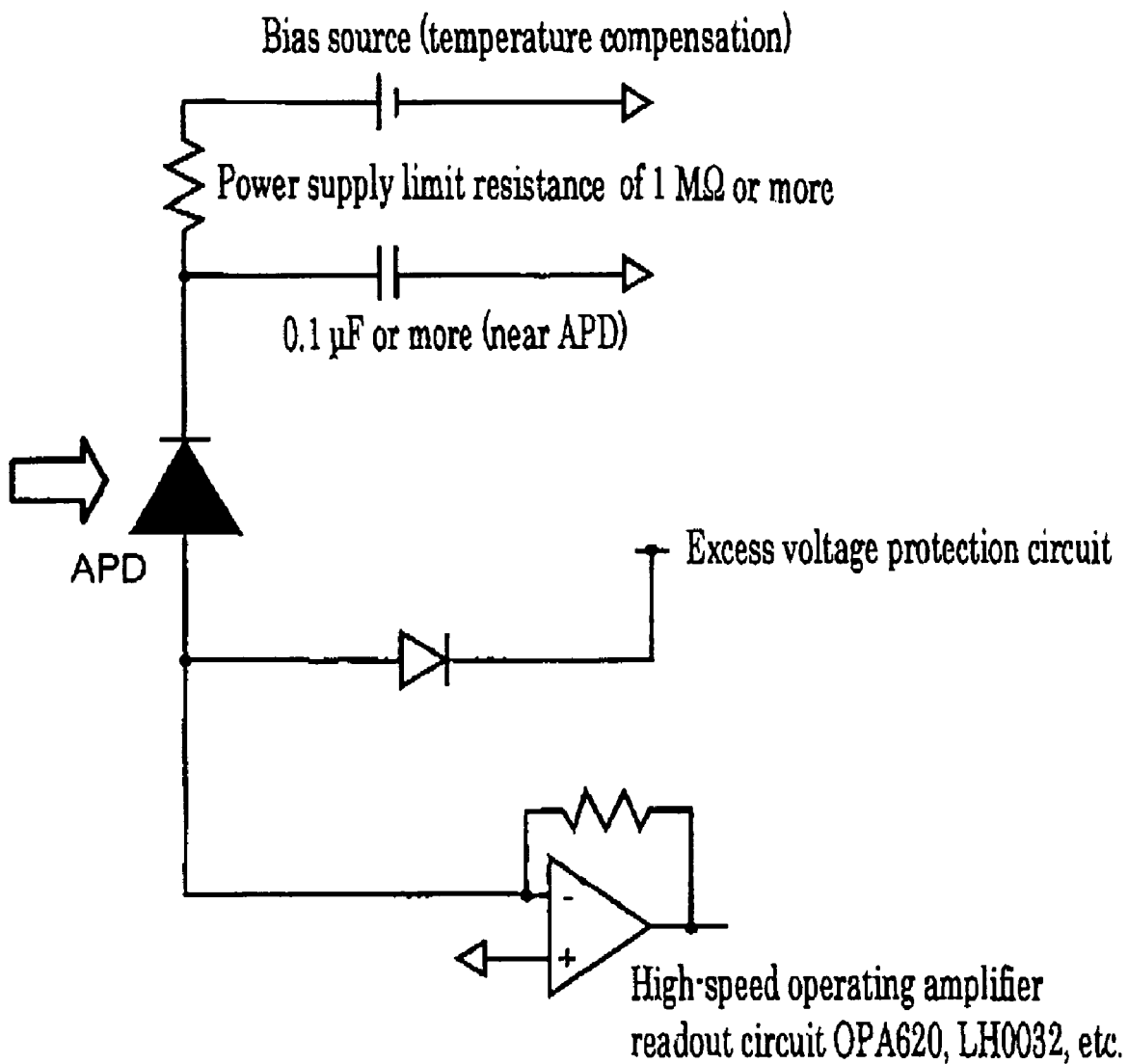
FIG. 10 is a diagram of a conventional circuit.

The circuit shown in FIG. 10 can be used for the low-level light detection section 1 in the configuration of FIG. 2 or FIG. 3. This circuit, which is one in conventional use, is not an accumulator type one, but one that outputs the APD output as it is. With the configuration of FIG. 2 or FIG. 3, the APD output can be read out as it is, without requiring the use of a reset.

EXAMPLE 3

Figure 4:
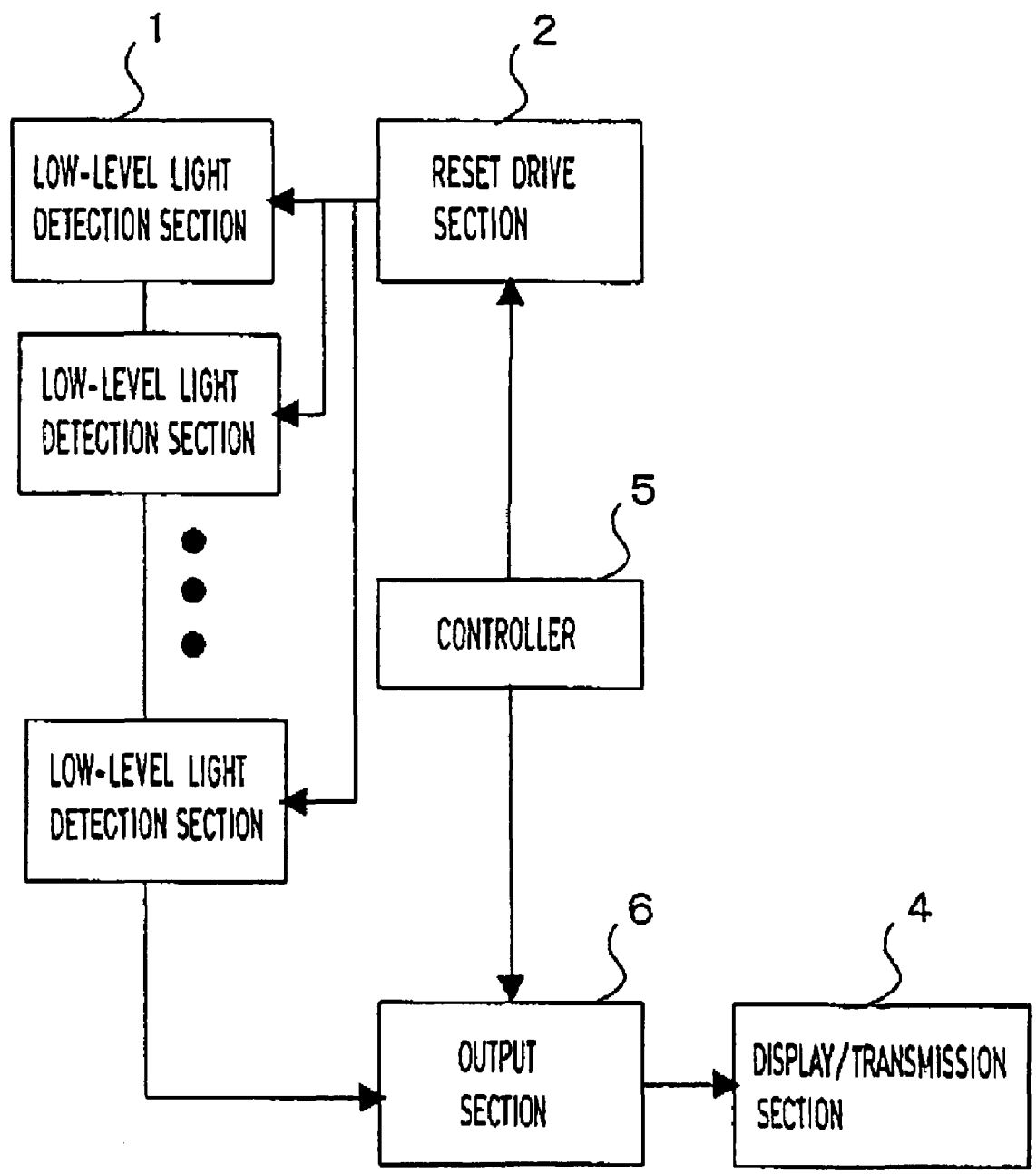
FIG. 4 is a block diagram of a low-level light detector comprising a plurality of low-level light detection sections arranged in a one-dimensional array.

FIG. 4 shows the low-level light detector 1 constituted as a plurality of low-level light detectors arranged in a one-dimensional array. In this case, under the control of the controller 5, completion of a sequential reading of the low-level light detectors is followed by a reset. Charges produced by light irradiation are accumulated between the read operations. In this way, accumulation, readout and reset are sequentially carried out with respect to each low-level light detector, under the control of the controller 5. The output gate 14 of FIG. 1 is used to select the low-level light detector to be read. In the configuration of FIG. 4, as in the configuration of FIG. 2, it is possible to perform readouts more frequently than resets.

Figure 5:
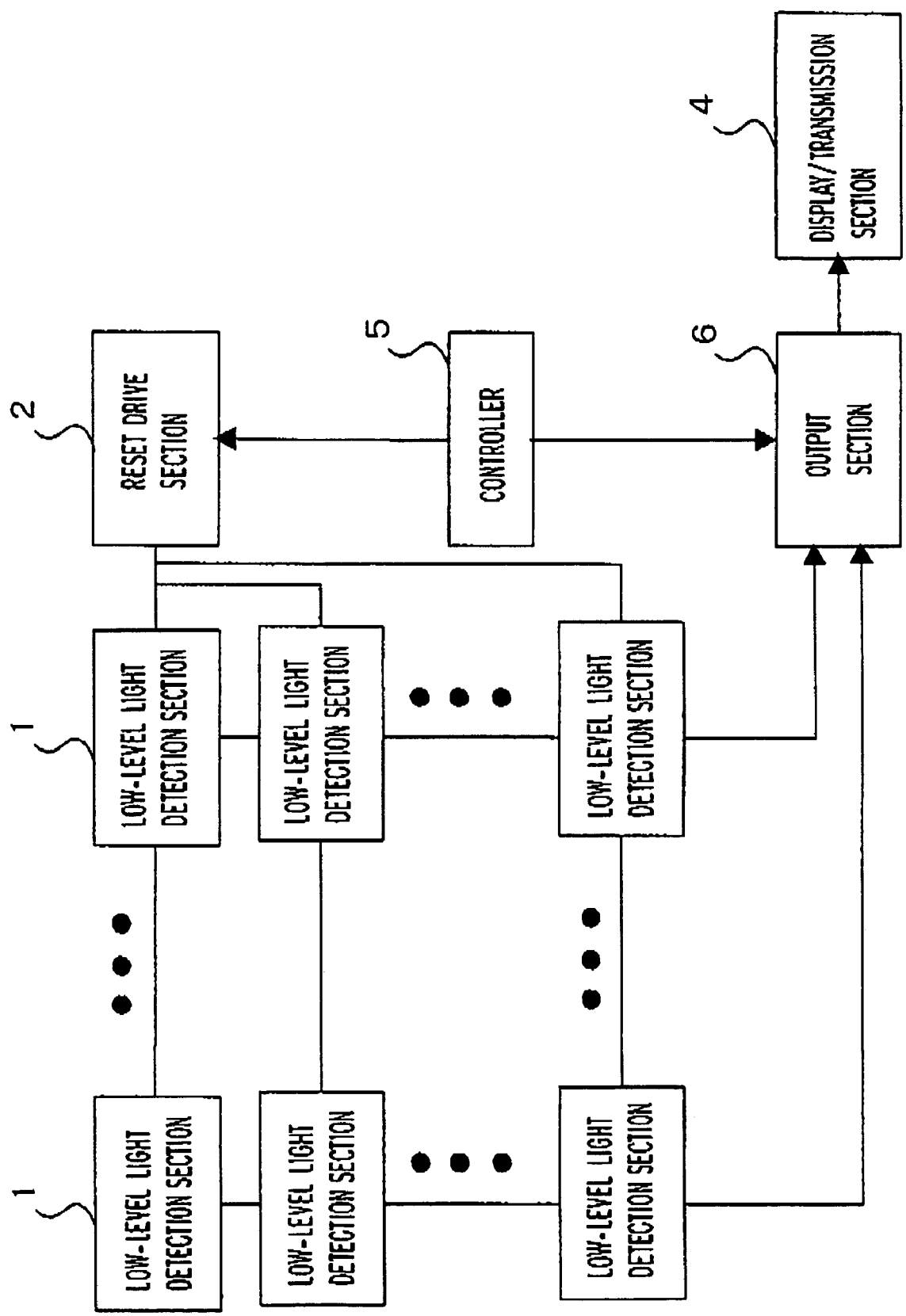
FIG. 5 is a block diagram of a low-level light detector comprising a plurality of low-level light detection sections arranged in a two-dimensional array.

FIG. 5 shows the low-level light detector 1 constituted by a plurality of low-level light detectors arranged in a two-dimensional array, the operation of which is substantially similar to the above configuration. Namely, under the control of the controller 5, completion of a sequential reading of the low-level light detectors is followed by a reset, and charges produced by light irradiation are accumulated between the read operations. Thus, accumulation, readout and reset are sequentially carried out with respect to each low-level light detector, under the control of the controller 5. The output gate 14 is used to select the sequence in which the low-level light detectors are read. In the configuration of FIG. 5, as in the configuration of FIG. 2, it is possible to perform readouts more frequently than resets.

As described in the foregoing, in accordance with this invention, a bias voltage region is used to provide the APD with a low multiplication factor. This bias voltage is lower than the voltage used in the prior art, facilitating monolithic integration. This allows one-dimensional or two-dimensional low-level light detectors to be manufactured at a higher density than is the case with conventional low-level light detectors.

In the present invention, when the multiplication factor falls within a range in which photons are linearly multiplied, the operation is performed based on the principle described above. It is confirmed by the present inventors that photons are linearly multiplied particularly when the multiplication factor is brought to not higher than 30. It is expected that the present invention can, of course, provide correct results even when the multiplication factor is brought to higher than 30.

What is claimed is:

1. A low-level light detector, comprising:
   an avalanche photodiode with a bias voltage adjusted to produce a multiplication factor of up to 30;
   a capacitor connected to the avalanche photodiode for accumulating carriers produced and multiplied in the avalanche photodiode;
   means for biasing of the avalanche photodiode;
   means for outputting of a capacitor voltage change; and
   means for controlling of the biasing and outputting means;
   wherein the low-level light detector detects an intensity of light impinging on the avalanche photodiode by periodically reading a capacitor voltage, obtaining differences between the voltages, and periodically resetting the capacitor voltage to a predetermined voltage before the capacitor is fully charged.

2. The low-level light detector according to claim 1, wherein the low-level light detector detects the intensity of light impinging on the avalanche photodiode by periodically reading the capacitor voltage, obtaining differences between the voltages, and resetting the capacitor voltage to the predetermined voltage each time it carries out the reading.

* * * * *